United States Patent [19]

Yu

[11] Patent Number: 5,712,183

[45] Date of Patent: Jan. 27, 1998

[54] METHOD OF FABRICATING A VIA FOR AN SRAM DEVICE

[75] Inventor: Tzu-Chiang Yu, Yungkang, Taiwan

[73] Assignee: Winbond Electronics Corporation, Taiwan

[21] Appl. No.: 697,026

[22] Filed: Aug. 16, 1996

[30] Foreign Application Priority Data

Jun. 29, 1996 [TW] Taiwan ................... 85107906

[51] Int. Cl.$^6$ ................................. H01L 21/8244
[52] U.S. Cl. .................... 437/60; 437/46; 437/191
[58] Field of Search ...................... 437/46, 47, 60, 437/191, 193, 918

[56] References Cited

U.S. PATENT DOCUMENTS

| 5,246,876 | 9/1993 | Manning | 437/191 |
| 5,298,782 | 3/1994 | Sandaresan | 437/191 |
| 5,393,689 | 2/1995 | Pfiester et al. | 437/60 |
| 5,462,894 | 10/1995 | Spinner et al. | 437/60 |

*Primary Examiner*—Chandra Chaudhari
*Attorney, Agent, or Firm*—Rabin, Champagne & Lynt, P.C.

[57] ABSTRACT

A method of fabricating a via, that reduces contact resistance between two conductive layers. A conductive layer is formed at the periphery of a top surface of a gate. An insulating layer is formed over the gate, and is etched to form a via exposing the top surface of the gate and portions of the conductive layer. The top surface of the gate and the exposed conductive layer form a step profile, which provides extra contact area without increasing the lateral extent of the via.

16 Claims, 5 Drawing Sheets

METHOD OF FABRICATING A VIA FOR AN SRAM DEVICE

BACKGROUND OF THE INVENTION

1. Field of the Invention

The invention relates in general to the fabrication of integrated circuits, and more particularly to the fabrication of a via that can be used to reduce contact resistance between two conductive layers.

2. Description of the Related Art

Due to the dimensional miniaturization of the gate terminals of metal oxide semiconductor (MOS) devices, the dimensions of gate contact vias are necessarily reduced as well. The shrinking dimensions of the gate and the via lead to a reduction in the contact surface area between two conductive layers in the via, resulting in an increase in contact resistance.

Static random access memory (SRAM) is a widely used integrated circuit component. FIG. 1 is a cross-sectional view showing the via structure of a conventional SRAM. A conventional method for manufacturing an SRAM includes the following steps.

First, a p-well 1a and field oxide layer 2a/2b are formed on a silicon substrate 1. A source/drain region 5, a gate oxide layer, and a gate 7 are then formed, for example, by ion doping of polysilicon. Next, sidewall spacers 7a and 7b are formed. An insulating layer 3 is then formed, followed by anisotropic etching of the insulating layer to form an opening exposing the source/drain region 5, and also forming a via 8 exposing the gate 7. Finally, a layer of polysilicon 4 is deposited over the entire construction to serve as an interconnect between the gate 7 and the source/drain region 5.

The lateral extent of the via 8 fabricated in the above SRAM has an effect on the contact resistance between the gate 7 and the polysilicon layer 4. When the level of integration in an integrated circuit is extremely high, dimensional reduction of the via not only increases the photolithographic budget, but also leads to an increase in contact resistance, thereby lowering the quality of the circuit.

SUMMARY OF THE INVENTION

It is therefore an object of the invention to provide a method of fabricating a via such that the contact resistance between two conductive layers is reduced without increasing the lateral extent of the contact surface area in the via.

To achieve the above-stated object, the invention provides a method of fabricating a via including the following steps. First, a silicon substrate is provided. Component areas are then defined on the surface of the silicon substrate by the selective formation of a field oxide layer. A gate insulating layer is then formed above one of the component areas. A first conductive layer covering all the above-mentioned layers is formed. A step oxide layer is formed above the first conductive layer and a masking layer is formed above the step oxide layer. Photolithographic and etching procedures are then utilized to define a pattern on the masking layer, so that the required gate positions are marked on top of the field oxide layer. Next, the step oxide layer is selectively etched, such that a portion of the step oxide layer beneath the masking layer is also etched, leaving an undercut structure and some residual oxide layer underneath the masking layer. A second conductive layer is formed above the first conductive layer and the masking layer, filling up the undercut structure as well. Using the masking layer as a gate mask, the second conductive layer and then the first conductive layer are etched to define a gate and a source/drain region. The masking layer is then removed. A first insulating layer is formed and then etched back to remove the residual oxide layer, and sidewall spacers are formed on sidewalls of the gate. A second insulating layer is then formed over the substrate. The second insulating layer is etched to form a first via above the gate, as well as a second via above the source/drain region. A step profile is thus formed within the first via by the exposed second conductive layer and second insulating layer. A third conductive layer acting as an interconnect between the gate and the source/drain region, through the first and second vias, is then formed.

BRIEF DESCRIPTION OF THE DRAWINGS

Other objects, features, and advantages of the invention will be apparent from the following detailed description of the preferred but non-limiting embodiment. The description is made with reference to the accompanying drawings, in which.

DETAILED DESCRIPTION OF THE PREFERRED EMBODIMENT

FIGS. 2A to 2L are cross-sectional views showing the processing steps for manufacturing an SRAM via according to a preferred embodiment of the invention.

Figure 1:
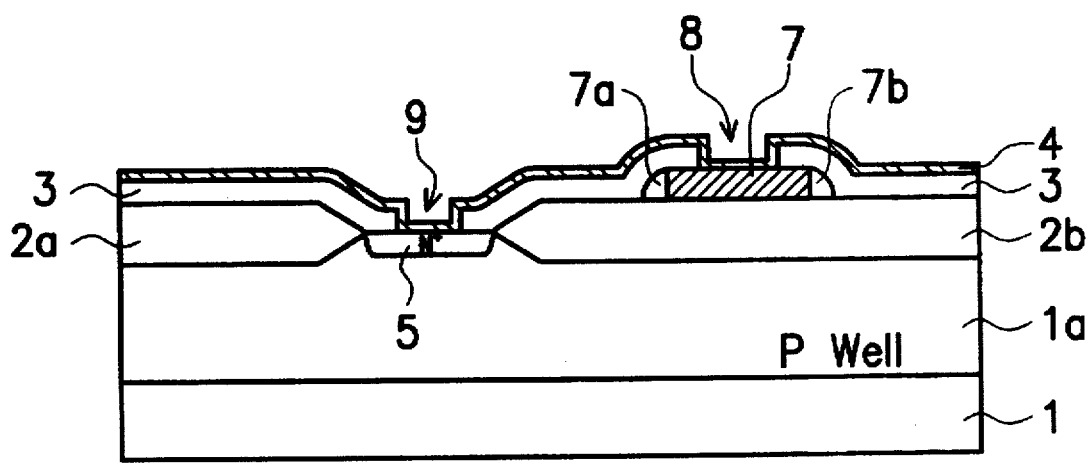
FIG. 1 is a cross-sectional view showing the structure of an SRAM via.
Figure 2A:
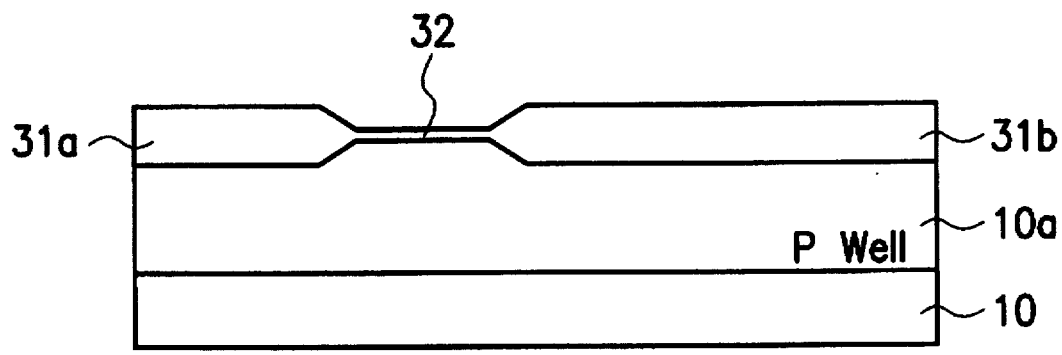
FIG. 2A to 2L are cross-sectional views showing the processing steps for manufacturing an SRAM via according to a preferred embodiment of the invention.

First, referring to FIG. 2A, a p-well is formed on a silicon substrate 10 by utilizing photolithographic techniques to define a pattern, followed by ion implantation and drive-in procedures. Then, field oxide layers 31a and 31b are selectively formed by a LOCOS method to define the component areas. Next, the threshold voltage ($V_T$) is adjusted by ion implantation, and a gate insulating layer 32, such as a gate oxide layer, is formed.

Figure 2B:
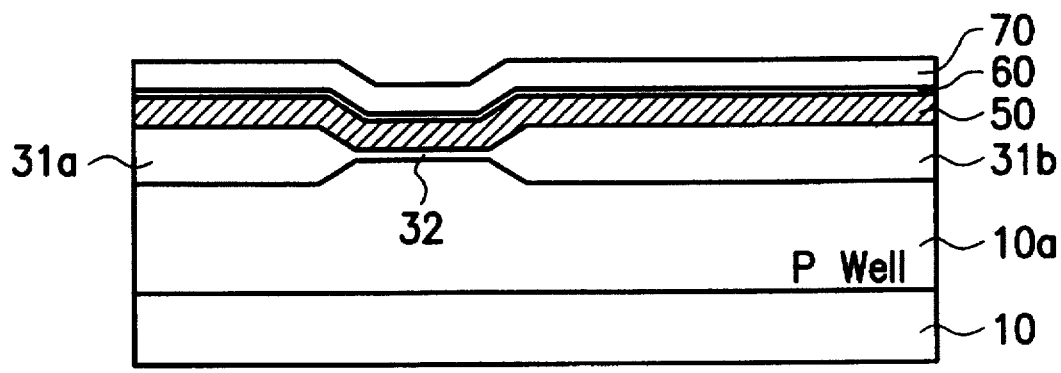

Referring to FIG. 2B, a first conductive layer 50 is formed over the substrate by, for example, low pressure chemical vapor deposition (LPCVD), to deposit a polysilicon layer having a thickness of about 2800 Å. Then, at a temperature of about 850° C., the polysilicon layer is doped by chemical reaction with the reactive gas phosphorus oxychloride ($POCl_3$) for 30 minutes, followed by the removal of resulting phosphorus glass on the reaction surface, using hydrofluoric acid (HF). Then, a step oxide layer 60 is formed on top of the first conductive layer 50 by, for example, putting The substrate in a wet atompshere at a temperature of about 850° C. to form a layer of silicon dioxide having a thickness of about 500 Å. Next, a masking layer 70 is formed above the step oxide layer 60 by, for example, LPCVD, to deposit a layer of silicon nitride ($Si_3N_4$) having a thickness of about 2500 Å.

Figure 2C:
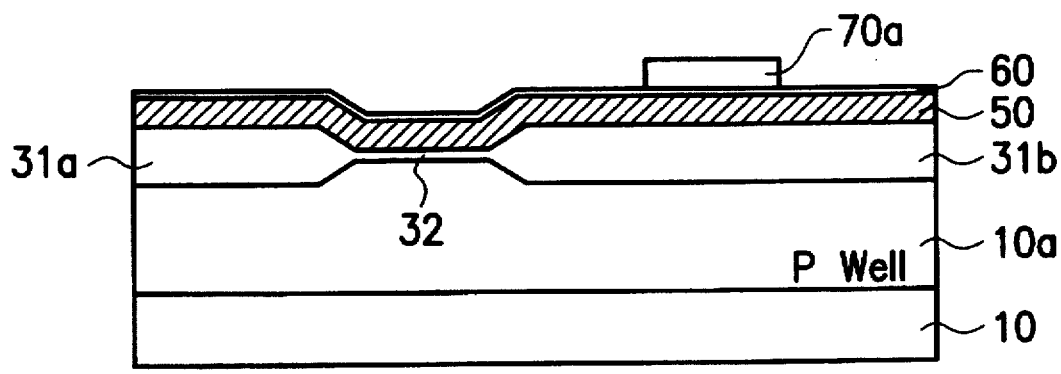

Referring to FIG. 2C, the masking layer 70 is patterned using a photolithographic technique and is then etched to define the position above the field oxide layer 31b where the gate will be formed. The masking layer 70 may be etched, for example, by coating a layer of photoresist above the masking layer 70, and then transferring the pattern to the photoresist, and thereafter removing a portion of the photoresist, followed by plasma etching of the portion of the masking layer 70 that is uncovered by the photoresist until the step oxide layer 60 is reached, leaving behind the masking layer 70a above the area where a gate is required.

Figure 2D:
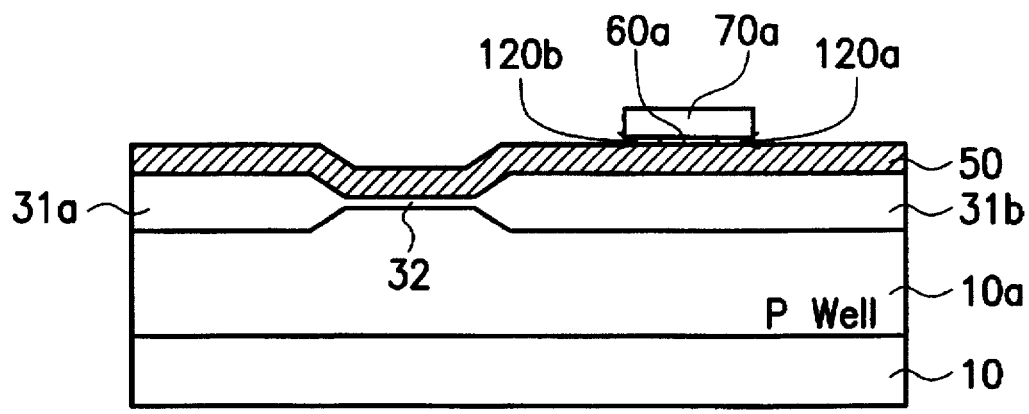

Referring to FIG. 2D, the step oxide layer 60 is isotropically etched, exposing the first conductive layer 50. Moreover, the etching extends inward into the peripheral area of the step oxide layer 60 underneath the masking layer 70a, forming an undercut structure 120a and 120b while retaining part of the oxide layer 60a beneath the masking layer 70a. Because the extent of the undercut depends on the concentration of etchant as well as the etching time, it is necessary to tailor the etching process to the specified dimensions. For example, design rules for fabrication of CMOS devices having a 0.4 µm line width require a 50:1 buffered oxide etchant (BOE) to be used in the etching process, and if the dimensional difference between the via and the gate is 0.15 µm, the distance from each edge of the masking layer 70a where the undercutting of the step oxide layer 60 occurs must also be 0.15 µm.

Figure 2E:
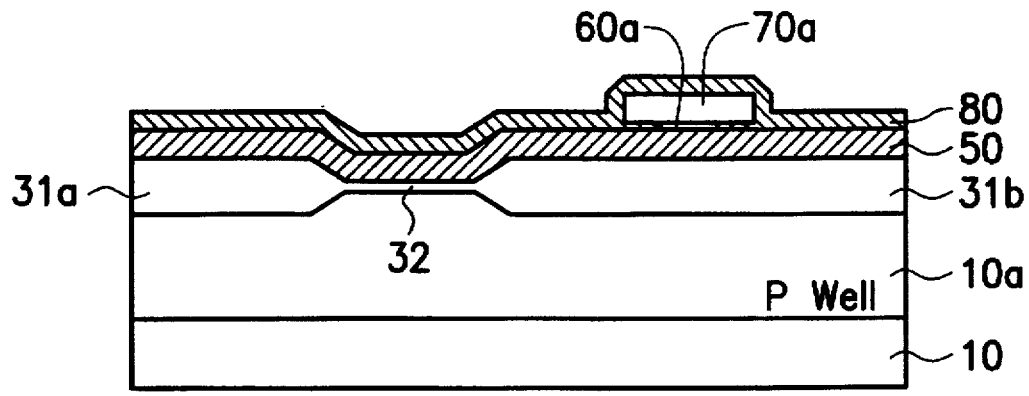

Referring to FIG. 2E, a second conductive layer 80 is formed above the first conductive layer 50 and the masking layer 70a. The second conductive layer 80 fills the undercut structure 120a and 120b as well. If the first conductive layer 50 is a doped polysilicon layer, an undoped polysilicon layer can be deposited as the first step in forming the second conductive layer. An annealing process is then performed to diffuse ions in the first conductive layer 50 into the undoped polysilicon layer, thus forming the second conductive layer 80.

Figure 2F:
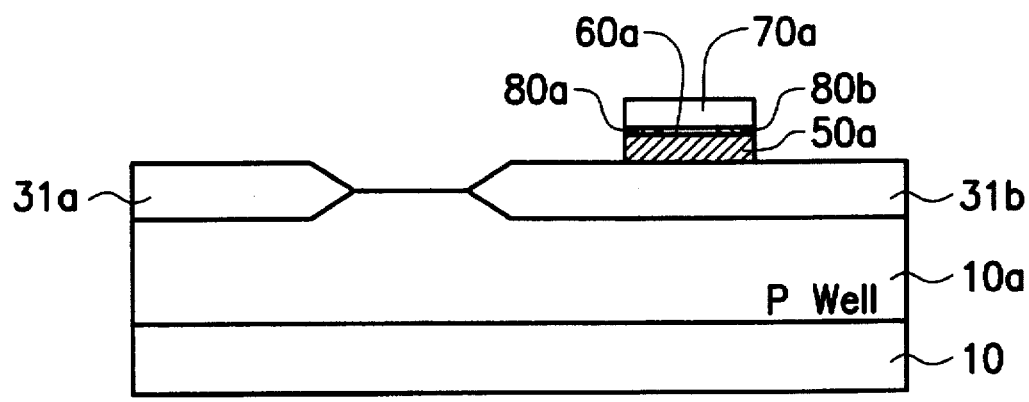

Referring to FIG. 2F, using the masking layer 70a as a gate mask, the second and then the first conductive layers are etched, both isotropically and anisotropically but in synchrony, to define a gate 50a as well as a source/drain region. As a result, portions of the second conductive layer 80a and 80b remain where the second conductive layer had filled the undercut structure 120a and 120b.

Figure 2G:
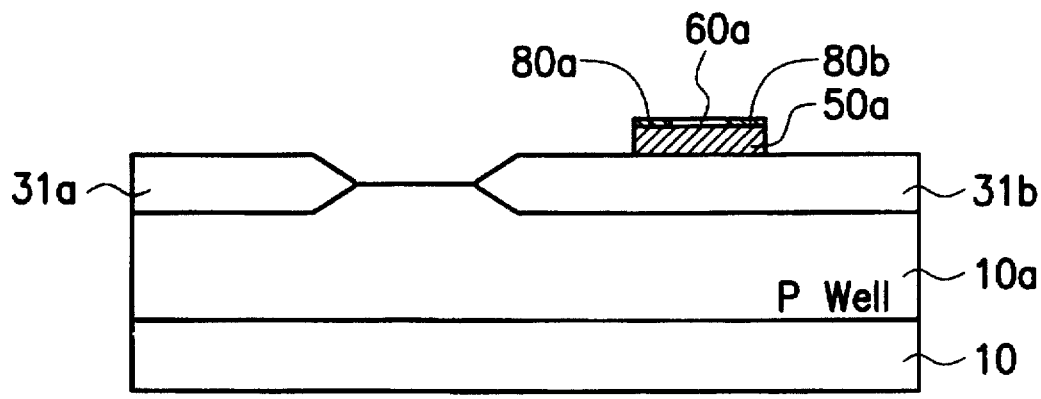
Figure 2H:
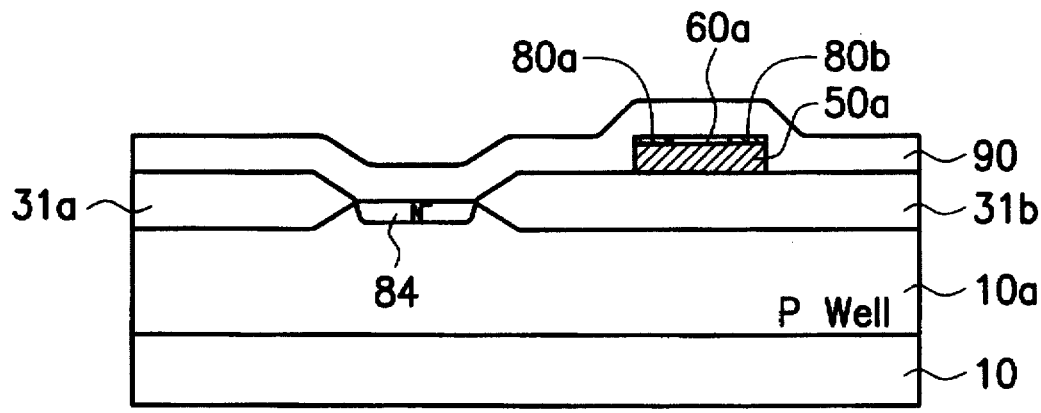

Referring to FIG. 2G, the masking layer 70a is removed. For example, phosphoric acid may be used to remove a silicon nitride masking layer. Next, referring to FIG. 2H, an N-type lightly doped drain (NLDD) or a P-type lightly doped drain (PLDD) type source/drain region 84 is formed. For example, an NLDD may be formed as an N-type lightly doped source/drain region. Then, a first insulating layer 90 is formed, for example, by using tetraethyl orthosilicate (TEOS) as a source of reactive gas and performing a low pressure chemical vapor deposition process to form an oxide layer of TEOS having a thickness of about 5000 Å.

Figure 2I:
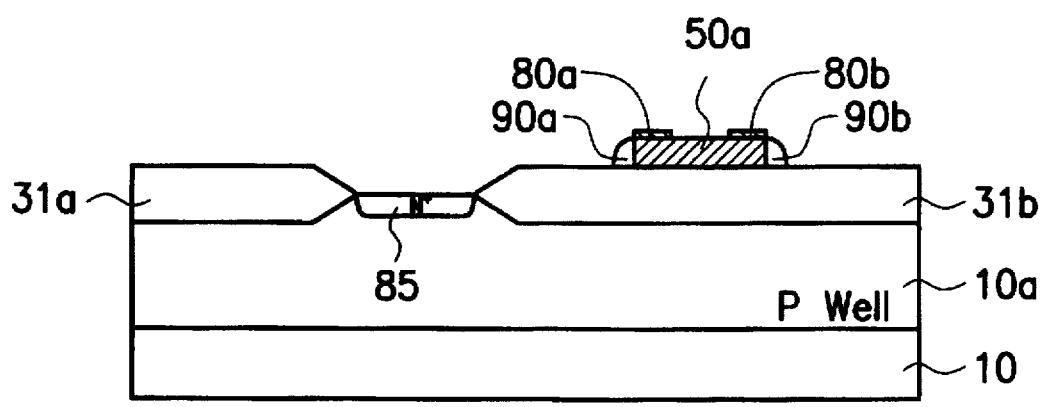

Referring to FIG. 2I, the first insulating layer 90 is then etched to remove the residual oxide layer 60a between the second conductive layer portions 80a and 80b, and then sidewall spacers 90a and 90b are formed at the sidewalls of gate 50a. Thereafter, a heavy doping process is performed to form a heavily doped source/drain region, for example an $N^+$ heavily doped source/drain region. When combined with the previously lightly doped source/drain region 84, a source/drain region 85 is created.

Figure 2J:
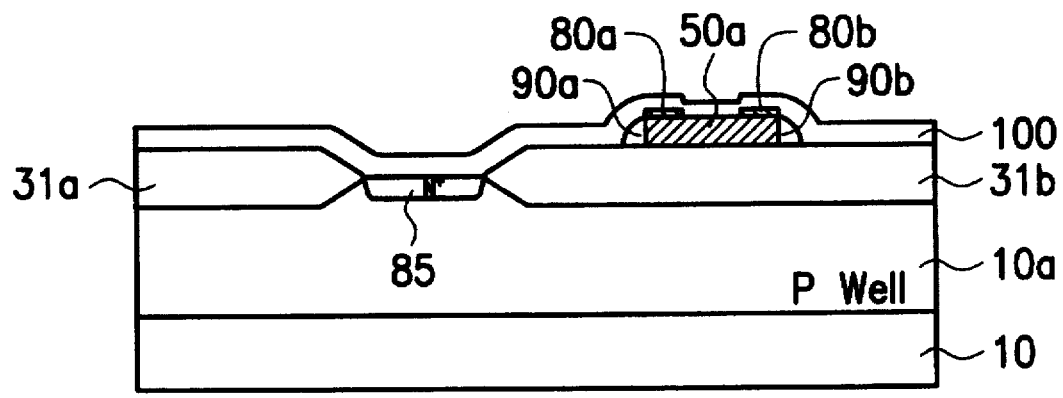
Figure 2K:
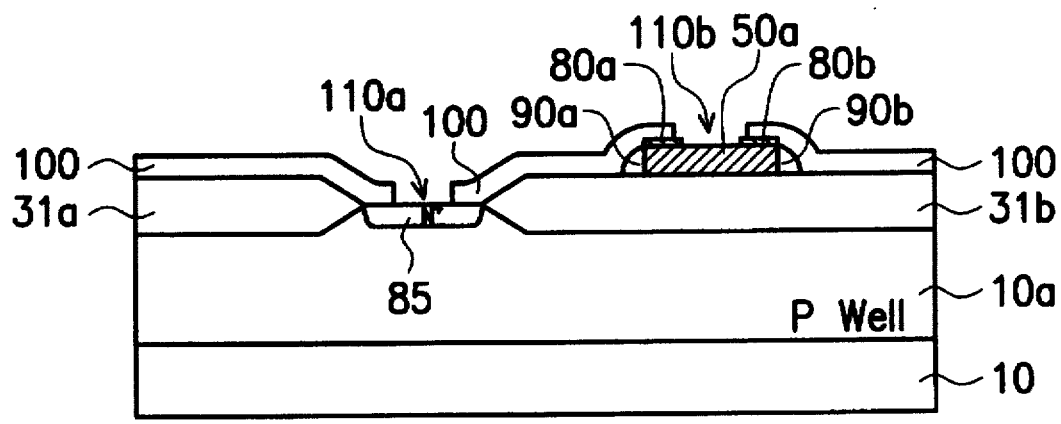

Referring to FIG. 2J, a second insulating layer 100 is formed, for example, using TEOS and an LPCVD method to deposit a TEOS oxide layer over the substrate. Then, referring to FIG. 2K, the second insulating layer 100 is anisotropically etched so as to form a via 110b above the gate 50a. A second via 110a is also formed above the surface of the source/drain region 85. Thus, the gate 50a and the second conductive layer portions 80a and 80b are exposed by the via 110b. The exposed portions of the gate 50a and the second conductive layer portions 80a and 80b, and the ends of the second insulating layer 100 defining the via 110b, together form a step profile.

Figure 2L:
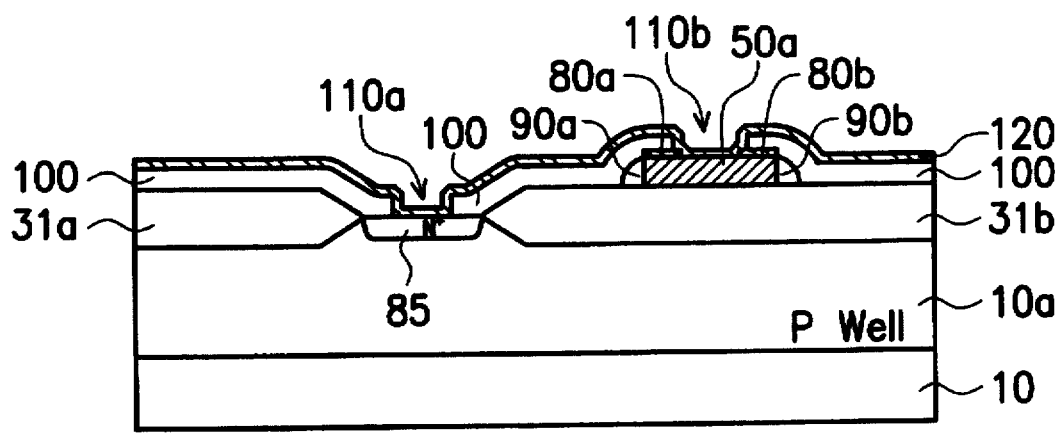

Referring to FIG. 2L, a third conductive layer 120 is formed to act as an interconnect between via 110a and via 110b, and thus between the gate 50a and the source/drain region 85. For example, a layer of polysilicon having a thickness of about 750 Å may be formed by LPCVD, and then may be heavily doped to increase its electrical conductivity. As shown in the figure, the via 110b has dimensions of 0.4 µm×0.4 µm when a 0.4 µm line-width CMOS manufacturing process is utilized. Due to the added profile steps provided by the second conductive layer 100 and the second conductive layer portions 80a and 80b, the contact length between the third conductive layer 120 and the gate 50a is lengthened by 0.1 µm.

In summary, according to the preferred embodiment of the invention, by forming the second conductive layer above and at the periphery of the gate surface, a via having a step profile is created. This via provides the advantage of an increased contact area between the gate and the interconnect to the source/drain region. In fact, two goals are achieved by the invention:

(1) When the lateral extent of the via is the same as in conventional structures, the contact resistance is lowered;

(2) Future miniaturization of device dimensions is possible without compromising contact resistance in the via by keeping the contact area high in the via.

According to the method of the invention for fabricating a via, contact resistance is lowered due to the increase in contact area between two conductive layers in the via. The invention is not only suitable for use in the manufacturing of static RAM components; it is also suitable for use in fabricating any integrated circuit components in which a lower contact resistance is desired.

While the invention has been described by way of example and terms of a preferred embodiment, it is to be understood that the invention is not limited thereto. To the contrary, it is intended to cover various modifications and similar arrangements. The appended claims, therefore, should be accorded the broadest interpretation so as to encompass all such modifications and similar arrangements.

What is claimed is:

1. A method of fabricating a via, comprising the steps of:
   (a) providing a silicon substrate;
   (b) defining component areas on the surface of the silicon substrate by selective formation of a field oxide layer;
   (c) forming a gate insulating layer above one of the component areas;
   (d) forming a first conductive layer over the silicon substrate;
   (e) forming a step oxide layer above the first conductive layer;
   (f) forming a masking layer above the step oxide layer;
   (g) performing a photolithographic and etching procedure on the masking layer to mark a gate position on the field oxide layer;
   (h) selectively etching the step oxide layer such that a portion of the step oxide layer beneath the masking layer is etched away, leaving an undercut structure and a residual oxide layer beneath the masking layer;
   (i) forming a second conductive layer above the first conductive layer, above the masking layer, and inside the undercut structure;
   (j) etching the second conductive layer and then the first conductive layer, using the masking layer as a gate mask, to define a gate and a source/drain region;
   (k) removing the masking layer;
   (l) forming a first insulating layer over the silicon substrate, and etching the first insulating layer to remove the residual oxide layer and a portion of the first insulating layer to form sidewall spacers on sidewalls of the gate;

(m) forming a second insulating layer;

(n) etching the second insulating layer to form a first via above the gate and a second via above the source/drain region, such that a step profile is formed within the first via by exposed portions of the second conductive layer; and (o) forming a third conductive layer connecting the gate and the source/drain region through the first and second vias.

2. A method according to claim 1, wherein the gate insulating layer is a gate oxide layer.

3. A method according to claim 1, wherein the step oxide layer has a thickness of about 500 Å.

4. A method according to claim 1, wherein the masking layer is a silicon nitride layer.

5. A method according to claim 4, wherein said step (k) includes the step of etching the masking layer using phosphoric acid.

6. A method according to claim 1, wherein said step (h) includes the step of etching the step oxide layer using a buffered oxide etchant.

7. A method according to claim 1, wherein said step (j) includes the step of etching the second and the first conductive layers utilizing isotropic and anisotropic etching techniques.

8. A method according to claim 1, wherein said step (m) includes the step of forming the second insulating layer by performing a low pressure chemical vapor deposition using tetraethyl orthosilicate to form an insulating oxide layer having a thickness of about 1500 Å.

9. A method according to claim 1, wherein the first conductive layer is an ion-doped polysilicon layer.

10. A method according to claim 9, wherein the second conductive layer is an undoped polysilicon layer.

11. A method according to claim 1, wherein the third conductive layer is an ion-doped polysilicon layer.

12. A method of fabricating a via, comprising the steps of:

(a) providing a silicon substrate having a p-well;

(b) defining component areas on the surface of the silicon substrate by selective formation of a field oxide layer;

(c) forming a gate insulating layer above one of the component areas;

(d) forming a first conductive layer over the silicon substrate;

(e) forming a step oxide layer above the first conductive layer;

(f) forming a masking layer above the step oxide layer;

(g) performing photolithographic and etching procedures on the masking layer to mark a gate position on the field oxide layer;

(h) selectively etching the step oxide layer such that a portion of the step oxide layer beneath the masking layer is etched away, leaving an undercut structure and a residual oxide layer beneath the masking layer;

(i) forming a second conductive layer above the first conductive layer, above the masking layer, and inside the undercut structure;

(j) etching the second conductive layer and then the first conductive layer, using the masking layer as a gate mask, to define a gate and an N-type source/drain region;

(k) removing the masking layer;

(l) forming a first insulating layer over the silicon substrate and etching the first insulating layer to remove the residual oxide layer and a portion of the first insulating layer to form sidewall spacers on sidewalls of the gate;

(m) forming a second insulating layer;

(n) etching the second insulating layer to form a first via above the gate, and a second via above the source/drain region, such that a step profile is formed within the first via by exposed portions of the second conductive layer; and (o) forming a third conductive layer connecting the gate and the source/drain region through the first and second vias.

13. A method of fabricating a via, comprising the steps of:

(a) providing a substrate;

(b) forming a field oxide layer on the substrate;

(c) forming a first conductive layer over the silicon substrate;

(d) forming a step oxide layer above the first conductive layer;

(e) forming a masking layer above the step oxide layer to mark a gate position;

(f) selectively removing a portion of the step oxide layer, including step oxide layer beneath a periphery of the masking layer, leaving a residual oxide layer beneath the masking layer;

(g) forming a second conductive layer above the first conductive layer beneath the periphery of the masking layer;

(h) selectively removing portions of the first conductive layer using the masking layer as a mask, to define a gate below the masking layer;

(i) removing the masking layer;

(j) removing the residual oxide layer;

(k) forming insulating sidewall spacers on sidewalls of the gate; and (l) forming a second insulating layer having a via above the gate, such that a step profile is formed within the via by exposed portions of the second conductive layer.

14. A method according to claim 13, further comprising the step of defining a source/drain region in the substrate.

15. A method according to claim 14, wherein the via is a first via, and said step (l) includes the step of forming a second via in the second insulating layer above the source/drain region.

16. A method according to claim 15, further comprising the step of forming a third conductive layer connecting the gate and the source/drain region through the first and second vias.

* * * * *